United States Patent

Hakimi et al.

Patent Number: 5,260,957
Date of Patent: Nov. 9, 1993

[54] QUANTUM DOT LASER

[75] Inventors: Farhad Hakimi, Watertown; Moungi G. Bawendi, Cambridge; Richard Tumminelli, Ashland; John R. Haavisto, Marshfield Hills, all of Mass.

[73] Assignee: The Charles Stark Draper Laboratory, Inc., Cambridge, Mass.

[21] Appl. No.: 969,784

[22] Filed: Oct. 29, 1992

[51] Int. Cl.$^5$ .............................. H01S 3/14
[52] U.S. Cl. ........................................ 372/39
[58] Field of Search ............ 372/39, 45, 46, 50

[56] References Cited

U.S. PATENT DOCUMENTS

| | | | |
|---|---|---|---|
| 4,139,342 | 2/1979 | Sheldrake et al. | 372/39 |
| 4,794,606 | 12/1988 | Kondow et al. | 372/39 |
| 4,794,616 | 12/1988 | Johnson | 372/39 |
| 5,200,969 | 4/1993 | Paoli | 372/20 |

Primary Examiner—Rodney B. Bovernick
Assistant Examiner—Robert E. Wise
Attorney, Agent, or Firm—Iandiorio & Dingman

[57] ABSTRACT

A quantum dot laser includes a laser host material; a plurality of quantum dots disposed in the host material; and a pumping source for exciting and inducing a population inversion in the quantum dots.

19 Claims, 2 Drawing Sheets

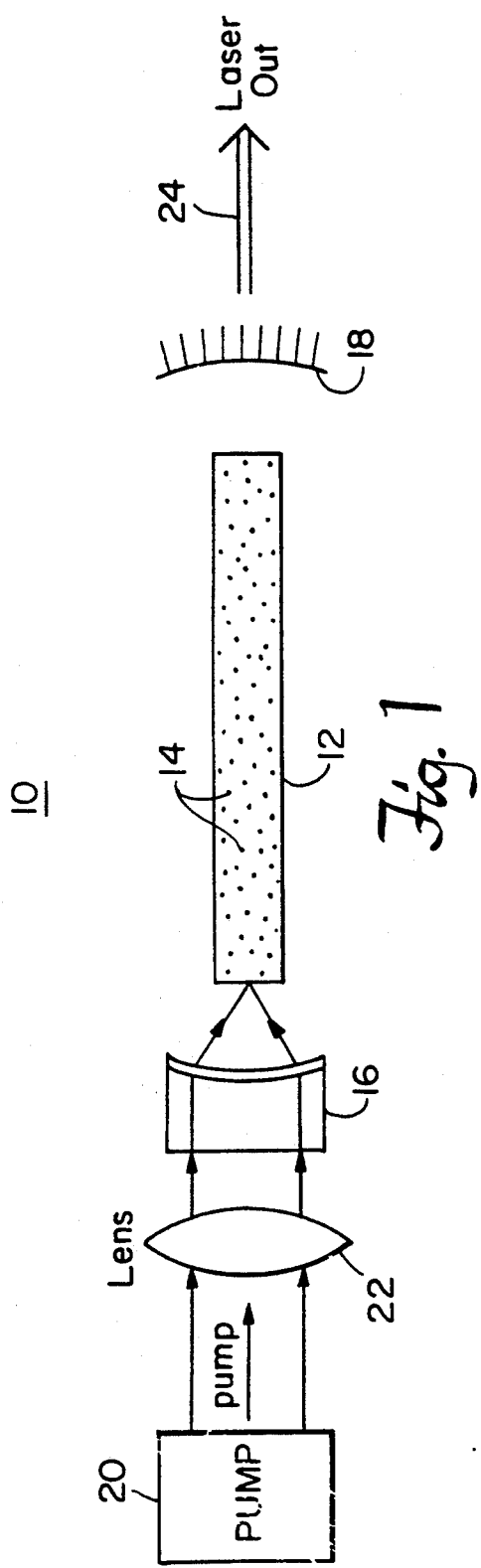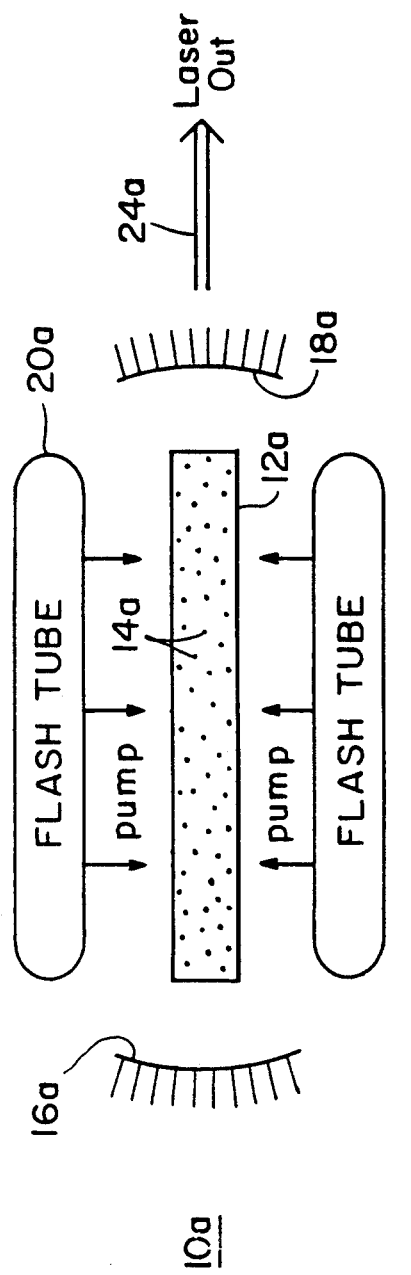

QUANTUM DOT LASER

FIELD OF THE INVENTION

This invention relates to an improved laser having both broad band and wide range specific band capability, and more particularly to a quantum dot laser which may be implemented in bulk optic or channel waveguided lasers.

BACKGROUND OF INVENTION

Conventional lasers generally provide very specific spectral outputs depending upon the laser material. If a spectral output other than that achievable with available laser materials or a less specific spectral output is desired, dye lasers or Ti-sapphire (Ti:Al$_2$O$_3$) lasers may be used. However, Ti-sapphire lasers are large and bulky. Dye lasers are large and bulky and also require fluid components which can be toxic.

Separately, there is increasing interest in optically interconnecting integrated circuits (IC) within multichip modules (MCM). This has been done using polymer waveguides to make passive components such as splitters and couplers in combination with electro-optic polymeric material to make switches and modulators. The complexity of such interconnect systems could be greatly reduced if the pumping lasers could be incorporated in the polymer waveguide material itself. However, doping the polymer with rare earth elements to create a laser has been unsuccessful because the polymer quenches the laser action. Even so, the demand for such devices has been strong because of the ease with which polymer components can be manufactured simply, easily, at low temperatures and with well-known and inexpensive materials and techniques.

SUMMARY OF INVENTION

It is therefore an object of this invention to provide an improved laser which can be constructed to produce a broad band of wavelength or any specific band over a wide range of wavelengths.

It is a further object of this invention to provide an improved laser which can be constructed in a striae free, low loss laser host material such as a polymer.

It is a further object of this invention to provide such an improved laser which can be easily fabricated into a waveguided structure.

It is a further object of this invention to provide a quantum dot laser.

It is a further object of this invention to provide a quantum dot waveguided laser.

It is a further object of this invention to provide a quantum dot waveguided polymer laser.

The invention results from the realization that true control over laser emission wavelength can be effected by disposing quantum dots of selected size and materials in a laser host medium and from the further realization that by using a laser host medium such as a polymer the laser can be incorporated in a waveguided structure.

This invention features a quantum dot laser having a laser host material and a plurality of quantum dots disposed in the host material. There is a pumping source for exciting and inducing a population inversion in the quantum dot laser to produce the laser action.

In a preferred embodiment the laser host material may be a polymer such as polymethylmethacrylate (PMMA). The quantum dots may be all the same size, they may be all the same material, or they may all be the same size and the same material. The pumping source may be an optical pumping source such as another laser. The quantum dot laser itself may be a bulk optic laser or it may be a channel waveguided laser wherein there is a cladding surrounding and having a lower refractive index than the host material. The host material may be a polymer. The cladding may also be a polymer. The quantum dots may be cadmium selenide, zinc telluride, cadmium telluride or zinc selenide, or any other semiconductor or similar material capable of more than a 50% population inversion.

The invention also features a quantum dot waveguided laser having a laser host material, a cladding surrounding and having a lower index of refraction than the host material, and a plurality of quantum dots disposed in the host material. There is a pumping source for exciting and inducing a population inversion in the quantum dots to produce the lasing action. The host material, and the cladding as well, may be a polymer.

DISCLOSURE OF PREFERRED EMBODIMENT

Other objects, features and advantages will occur to those skilled in the art from the following description of a preferred embodiment and the accompanying drawings, in which:

FIG. 1 is a schematic side elevational view of an end-pumped bulk quantum dot laser according to this invention;

FIG. 2 is a view similar to FIG. 1 of a flash tube side pumped quantum dot laser according to this invention;

Figure 3:
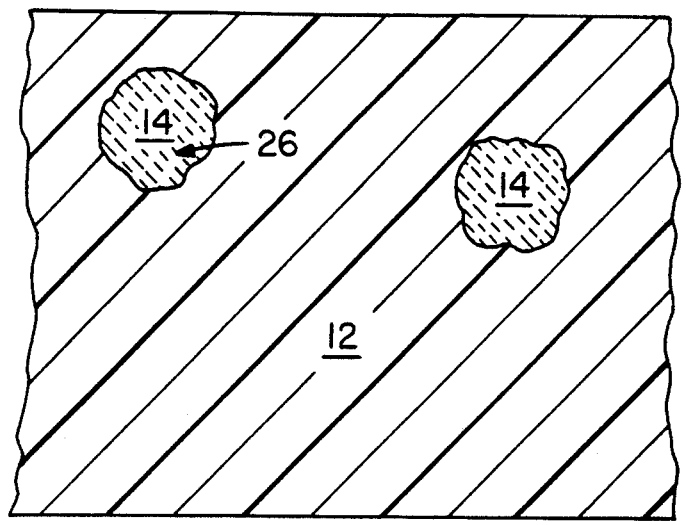
FIG. 3 is a greatly enlarged section of the host material showing the quantum dots disposed in it.

The quantum dot laser according to this invention may be accomplished using a laser host material which is typically low-loss, striae free, and optically clear. Disposed in this laser host material are a plurality of quantum dots. Quantum dots are a phenomenon being widely investigated. They are very small clusters of atoms on the order of 50 Å in diameter, which are embedded in a material such as a polymer for investigation. They are energized by a light source so that common fluorescence is induced. Using this fluorescence, the surface effects and chemical activity of these very small quantities of atoms are investigated. (See: M. G. Bawendi, P. J. Carroll, W. L. Wilson, and L. E. Brus, *J. Chem. Phys.* Vol. 96 No. 2, Jan. 15, 1992, Page 946, "Luminescence Properties of CdSe Quantum Crystallites: Resonance Between Interior and Surface Localization States"; M. G. Bawendi, W. L. Wilson, L. Rothberg, P. J. Carroll, T. M. Jedju, M. L. Steigerwald, and L. E. Brus, *Physical Review Letters*, Vol. 65, No. 13, Sep. 24, 1990, Page 1623, "Electronic Structure and Photoexcited-Carrier Dynamics in Nanometer-Size CdSe Clusters"; and M. G. Bawendi, M. L. Steigerwald, and L. E. Brus, *Annu. Rev. Phys. Chem.* 41, Page 477, 1990.) The fluorescence of these quantum dots occurs at a wavelength determined not only by the type of material, which is usually but not always a semiconductor material such as zinc selenide or telluride, or cadmium selenide or telluride, but also by the size or diameter of the dot. That is, the fluorescing wavelength of a cadmium selenide quantum dot, for example, can be made to change within a predetermined range by changing the physical diameter of the dot itself. With a plurality of such quantum dots disposed in the host material, the laser is formed by applying a pumping source which will excite and induce a population inversion of more than 50% in the quantum dots. The host material may be made of a polymer such as a polymethylmethacrylate (PMMA). The quantum dots may be made all of the same size and the same material so that a single narrow spectral band is produced, or they can be made of different materials or the same material in different sizes in order to get a spectral band of a broader range. Or the material and the size of the quantum dots may be varied in order to obtain an even broader spectral range. In this manner, a very narrow band width laser output can be provided, or a very broad band width can be provided, and suitable filtering and tuning can be used. In this way the laser may be engineered mechanically, physically, to provide a specific spectral band, a number of bands or a broad band range, without the need for a variety of optical and electro-optical tuning and filtering systems. The laser can be pumped optically and should also be capable of being pumped electrically. Such a laser may be provided with a cladding which surrounds and has a lower refractive index than the host material so that a channel waveguided laser is constructed. In one such construction the host material may be a polymer, and the cladding, too, may be a polymer.

There is shown in FIG. 1 a bulk laser 10 according to this invention which includes a laser host material 12 such as PMMA or any other suitable low-loss striaefree, optically clear material. Disposed in host material 12 are a multiplicity of quantum dots 14 made of cadmium selenide which fluoresces at 550 nm. A mirrored element 16 is disposed at one end of the host material 12 and a partially silvered mirror 18 is disposed at the other. A suitable pumping source 20 such as an argon ion laser provides a pumping energy at a wavelength of 488 nm which is submitted through lens 22 and mirror 16 to energize the quantum dots 14 in host material 12. The laser output beam 24 exits partially reflective mirror 18. A similar side pumped bulk laser 10a, FIG. 2, may be pumped using flash tube 20a which side pumps quantum dots 14a in host material 12a.

Quantum dots 14a are shown enlarged and in greater detail in FIG. 3 in the form of two quantum dots 14. In this case the host medium 12 is PMMA. The quantum dots containing a multiplicity of atoms 26 indicated generally by the crosshatching, are formed in 50 Å dots of cadmium selenide. Each of these dots will lase upon suitable pumping, whereupon the population inversion is greater than 50%.

Figure 4:
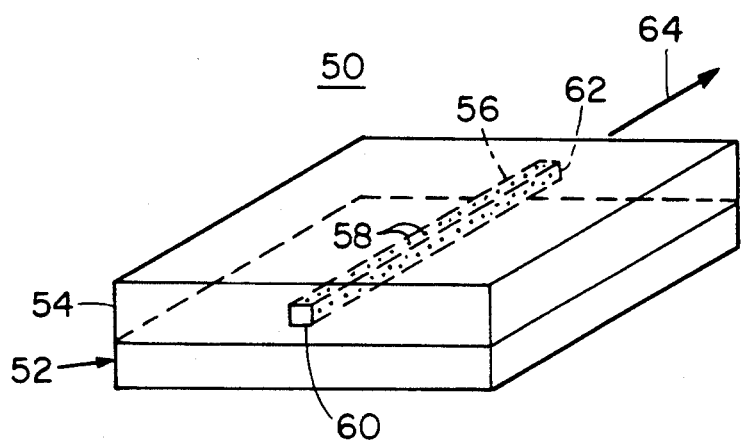
FIG. 4 is a three-dimensional view of a quantum dot channel waveguided laser.

Although thus far only bulk lasers have been shown employing the quantum dots, this is not a necessary limitation of the invention. A quantum dot channel waveguided laser 50, FIG. 4, may be conveniently formed on a substrate 52 of silica or aluminum oxide, for example, using a waveguide or cladding layer 54 which can be a polymer having an index of refraction of 1.49. Embedded in the cladding or host layer 54 is a channel waveguide laser element 56.

Embedded in cladding or host layer 54 is channel waveguide laser element 56 which is also formed of a polymer having an index of refraction of 1.50, which is slightly higher than that of cladding layer 54. Disposed in channel waveguide laser element 56 are a multiplicity of quantum dots 58. Pumping can be effected from either end 60, 62 of channel waveguided laser element 56. Each end is mirrored, and the laser beam 64 exits the less reflective end 60. Since the quantum dot channel waveguided laser 50 of FIG. 4 can be made with common polymers, many manufacturing problems are avoided. Using polymers, the manufacturing process can be carried out quickly, easily, using common materials and techniques at room temperature, and truly integrated optical systems can be made since the passive components such as splitters and couplers may be made in combination with electro-optic polymeric material to make switches and modulators, and the lasers can be included with them. In addition, the optical and electro-optical components can be fabricated with electrical components in a totally integrated fabrication.

Figure 5:
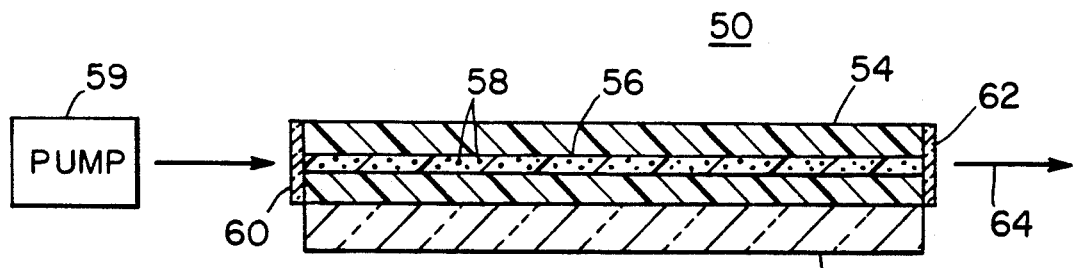
FIG. 5 is a side sectional view of the quantum dot channel waveguided laser of FIG. 4.

The pumped radiation is introduced from pump 59, FIG. 5, into mirrored end 60 of channel waveguided laser element 56 which provides output beam 64 through mirrored surface 62.

Figure 6:
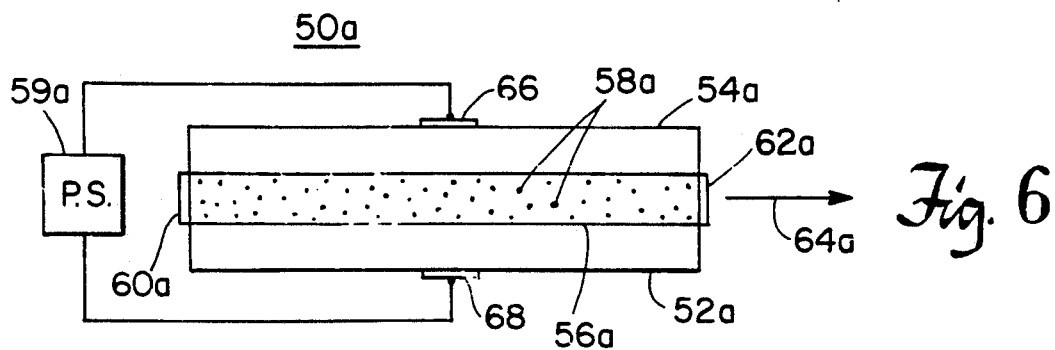
FIG. 6 is a three-dimensional schematic view of an electrically pumped quantum dot channel waveguided laser according to this invention.

Alternatively, channel waveguided laser 50a, FIG. 6, may be pumped electrically by connecting an electrical power source 59a across two electrodes 66 and 68 to provide an electric field across laser element 56a to pump quantum dots 58a and provide the necessary population inversion to result in the lasing action that produces output beam 64a.

Although specific features of the invention are shown in some drawings and not others, this is for convenience only as some feature may be combined with any or all of the other features in accordance with the invention.

Other embodiments will occur to those skilled in the art and are within the following claims:

What is claimed is:

1. A quantum dot laser comprising:
   a laser host material;
   a plurality of quantum dots disposed in said host material; and
   a pumping source for exciting a population inversion in said quantum dots.

2. The quantum dot laser of claim 1 in which said laser host material is a polymer.

3. The quantum dot laser of claim 2 in which said polymer is polymethylmethacrylate (PMMA).

4. The quantum dot laser of claim 1 in which said quantum dots are all the same size.

5. The quantum dot laser of claim 1 in which said quantum dots are all the same material.

6. The quantum dot laser of claim 1 in which said quantum dots are all the same material and the same size.

7. The quantum dot laser of claim 1 in which said pumping source is an optical pumping source.

8. The quantum dot laser of claim 1 in which said laser is a bulk optic laser.

9. The quantum dot laser of claim 1 in which said laser includes a cladding surrounding said host material and having a lower refractive index than said host material and said laser is a channel waveguide laser.

10. The quantum dot laser of claim 9 in which said host material is a polymer.

11. The quantum dot laser of claim 10 in which said cladding is a polymer.

12. The quantum dot laser of claim 1 in which said host material is a polymer.

13. The quantum dot laser of claim 1 in which said quantum dots are cadmium selenide.

14. The quantum dot laser of claim 1 in which said quantum dots are zinc telluride.

15. The quantum dot laser of claim 1 in which said quantum dots are cadmium telluride.

16. The quantum dot laser of claim 1 in which said quantum dots are zinc selenide.

17. A quantum dot waveguide laser comprising:
a laser host material;
a cladding surrounding and having a lower index of refraction than said host material;
a plurality of quantum dots disposed in said host material; and
a pumping source for exciting and inducing a population inversion in said quantum dots.

18. The quantum dot waveguide laser of claim 17 in which said host material is a polymer.

19. The quantum dot waveguide laser of claim 17 in which said cladding is a polymer.

* * * * *